United States Patent [19]

Ishihara et al.

[11] Patent Number: 5,178,904
[45] Date of Patent: * Jan. 12, 1993

[54] PROCESS FOR FORMING DEPOSITED FILM FROM A GROUP II THROUGH GROUP VI METAL HYDROCARBON COMPOUND

[75] Inventors: Shunichi Ishihara, Ebina; Shigeru Ohno, Yokohama; Masahiro Kanai; Shunri Oda, both of Tokyo; Isamu Shimizu, Yokohama, all of Japan

[73] Assignee: Canon Kabushiki Kaisha, Tokyo, Japan

[*] Notice: The portion of the term of this patent subsequent to Sep. 20, 2005 has been disclaimed.

[21] Appl. No.: 507,001

[22] Filed: Apr. 10, 1990

Related U.S. Application Data

[63] Continuation of Ser. No. 212,096, Jun. 27, 1988, abandoned, which is a continuation of Ser. No. 828,543, Feb. 12, 1986, abandoned.

[30] Foreign Application Priority Data

Feb. 16, 1985 [JP] Japan .................................. 60-28794
Feb. 16, 1985 [JP] Japan .................................. 60-28795

[51] Int. Cl.$^5$ ........................ B05D 3/06; C23C 16/00; C01B 00/00
[52] U.S. Cl. .................................. 427/523; 427/252; 427/253; 427/255.2; 427/585; 427/595; 204/157.4
[58] Field of Search ............... 427/38, 39, 53.1, 252, 427/253, 255.1, 255.2; 204/157.15, 157.3, 157.4; 118/719

[56] References Cited

U.S. PATENT DOCUMENTS

| | | | |
|---|---|---|---|
| 3,271,180 | 9/1966 | White | 204/157.15 |
| 3,288,829 | 11/1966 | Wilkinson | 204/157.4 |
| 3,907,616 | 9/1975 | Weimer | 148/188 |
| 3,914,515 | 10/1975 | Kane et al. | 427/252 |
| 4,042,006 | 8/1977 | Engl et al. | 427/252 |
| 4,147,571 | 4/1979 | Stringfellow et al. | 148/175 |
| 4,220,488 | 9/1980 | Duchemin et al. | 118/719 |
| 4,321,073 | 3/1982 | Blair | 427/252 |
| 4,422,888 | 12/1983 | Stutius | 148/175 |
| 4,504,329 | 3/1985 | Quinlan et al. | 148/175 |
| 4,504,518 | 3/1985 | Ovshinsky | 427/38 |
| 4,509,997 | 4/1985 | Cockayne et al. | 148/175 |
| 4,532,199 | 7/1985 | Ueno et al. | 427/39 |
| 4,564,997 | 1/1986 | Matsuo et al. | 427/38 |
| 4,615,905 | 10/1986 | Ovshinsky | 427/39 |
| 4,657,777 | 4/1987 | Hirooka et al. | 427/38 |
| 4,717,586 | 1/1988 | Ishihara et al. | 427/53.1 |
| 4,772,486 | 9/1988 | Ishihara et al. | 427/39 |
| 4,849,249 | 7/1989 | Ishihara et al. | 427/38 |
| 4,900,694 | 2/1990 | Nakagawa | 427/39 |

Primary Examiner—Marianne Padgett
Attorney, Agent, or Firm—Fitzpatrick, Cella, Harper & Scinto

[57] ABSTRACT

A process for forming a deposited film on a substrate in the absence of a plasma is conducted by generating in an activation space an activated species capable of chemically reacting with a compound for film formation and introducing into a film-forming space having the substrate, the activated species and the compound for film formation. The compound for film formation has the general formula $R_nM_m$ wherein R is a hydrocarbon radical, M is an element selected from one of Groups II-IV, n is an integer equal to the valence of M and m is a positive integer equal to the valence of R. The film-forming space is remote from the activation space. The activated species initiates a chemical reaction with the compound for film formation sufficient to generate chemical species of said film-forming compound capable of directly forming the deposited film.

4 Claims, 1 Drawing Sheet

PROCESS FOR FORMING DEPOSITED FILM FROM A GROUP II THROUGH GROUP VI METAL HYDROCARBON COMPOUND

This application is a continuation of application Ser. No. 212,096, filed Jun. 27, 1988, now abandoned, which, in turn, is a continuation of application Ser. No. 828,543, filed Feb. 12, 1986, now abandoned.

BACKGROUND OF THE INVENTION

1. Field of the Invention

The present invention relates to a process for forming a deposited film adapted for use as an amorphous or crystalline functional film for example as a semiconductor, insulator, conductor or metal, in particular for an active or passive semiconductor device, an optical semiconductor device, a solar cell or an electrophotographic photosensitive device.

2. Description of the Prior Art

A deposited film can be formed for example by the vacuum evaporation, plasma CVD, thermal CVD, photo CVD, reactive sputtering, ion plating methods etc., among which the plasma CVD method has been employed both widely and commercially.

However the deposited film obtained by these methods still has room for improvement. In particular, for achieving application to electronic devices of higher performance, in electrical and optical properties, fatigue and other environmental characteristics in repeated use, and in productivity and mass productivity including uniformity and reproducibility, deposited films need improvement.

The reaction process involved in the formation of deposited film by conventional plasma CVD methods is considerably more complex than that for the so-called thermal CVD method, and is still unclear in various aspects. Also the formation of deposited film relies on a number of parameters such the substrate temperature, flow rate and ratio of introduced gases, pressure during film formation, high-frequency electric power, electrode structure, reactor structure, gas exhaust rate, plasma generating method etc. The plasma may become temporarily unstable to endow significant undesirable properties to the formed film. Besides it has been difficult to generalize the manufacturing conditions since certain parameters have to be determined specifically for each apparatus employed.

Among the aforementioned methods, the plasma CVD method is regarded as best as it can provide an amorphous silicon film with electrical and optical properties meeting the requirements of various applications.

However, in certain applications of the deposited film, the formation thereof by the plasma CVD method not only requires a large investment for the manufacturing apparatus but also necessitates complex process controls with narrow tolerances and delicate adjustments, in order to achieve reproducible mass production with a large area, a uniform film thickness and uniform quality.

On the other hand, the conventional ordinary CVD technology not only requires a high temperature but also is unable to produce, on a commercial basis, a deposited film with satisfactory characteristics.

It has therefore been desired to develop a process of forming a functional film on a large scale with an inexpensive apparatus while maintaining practical properties and uniformity.

SUMMARY OF THE INVENTION

In consideration of the foregoing, an object of the present invention is to provide a novel process for forming a deposited layer, free from the above-explained drawbacks of the conventional methods, particularly of the plasma CVD method.

Another object of the present invention is to provide a process for forming a deposited film capable of easily controlling the characteristic of the functional film and for improving the film forming speed and for producing the film on a commercial basis, while at least maintaining the satisfactory properties of the film obtained by the conventional methods and, further simplifying the control of the film forming conditions.

According to an aspect of the present invention, there is provided a process which comprises introducing, into a film forming space for forming a deposited film on a substrate, a compound as a material for film formation, represented by a following general formula:

$$R_n M^1_m \quad (A\text{-}1)$$

wherein m is a positive integer equal to the valence of R, n is a positive integer equal to the valence of $M^1$, $M^1$ stands for an element of the group II of the periodic table, the group III, V and VI thereof in the 3rd and ensuing period, and the group IV in the 4th and ensuing period and R stands for a hydrocarbon radical; and active species capable of chemically reacting with said compound, thereby forming a deposited film on said substrate.

According to another aspect of the present invention, there is provided a process which comprises introducing, into a film forming space for forming a deposited film on a substrate, a compound as a material for film formation, represented by a following general formula:

$$R_n M^2_m \quad (A\text{-}2)$$

wherein m is a positive integer equal to the valence of R, n is a positive integer equal to the valence of $M^2$, $M^2$ stands for an element of the group II of the periodic table, the group III, IV, V and VI in the 3rd and ensuing period, and R stands for a hydrocarbon radical; and active halogen capable of chemically reacting with said compound, thereby forming a deposited film on said substrate.

DESCRIPTION OF THE PREFERRED EMBODIMENTS

Figure 1:
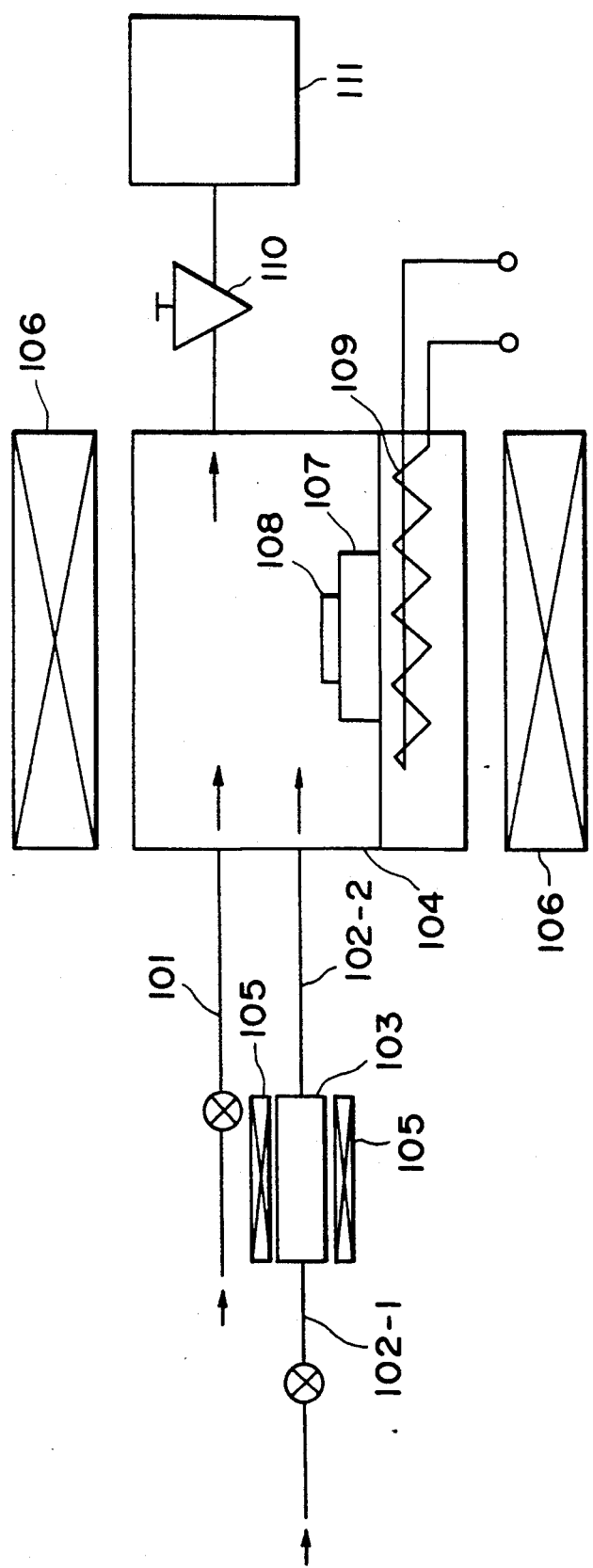
FIG. 1 is a schematic view of a manufacturing apparatus for executing the process of the present invention.

According to the present invention, the formation of a deposited film of a desired function can be governed by, as film forming parameters, the amounts of the aforementioned compound of the general formula A-1, or A-2 and of the active species capable of chemically reacting with said compound of the general formula A-1 or A-2, temperatures of the substrate and in the film forming space, and pressure in said film forming space, and can therefore be easily controlled. A functional deposited film can therefore be mass produced in reproducible manner.

Active species employed in the present invention have a function of causing a chemical interaction with said compound of the formula A-1 or A-2 to supply energy thereto or to chemically react therewith, thereby rendering said compound capable of forming a deposited film. Consequently the active species may or may not contain a component which will become a component of the deposited film to be formed.

The compounds A-1 and A-2, represented by the foregoing general formulas A-1 and A-2 are preferably those capable of inducing a chemical reaction through molecular collisions with said active species, thereby spontaneously generating chemical species contributing to the formation of a film on the substrate. However, if said compound A-1 or A-2 is not active enough or not reactive with said active species in the normal state, it is necessary to provide such compound A-1 or A-2, at or before the film formation, with an excitation energy not enough for causing complete dissociation of the element $M^1$ or $M^2$ in said general formula A-1 or A-2, but sufficient to bring the compound A-1 or A-2 to an excited state for enabling the chemical reaction with the active species. A compound that can be brought to such excited state may be employed as one of the compounds A-1 and A-2 in the present invention.

In the present invention, the compound in the excited state will hereinafter called excited species.

Examples of the compound A-1, represented by the general formula (A-1) $R_nM^1_m$, that effectively employed in the present invention are those compounds which contain, as the component $M^1$, an element selected from the group II of the periodic table, the groups III, V and VI in the 3rd and ensuing periods, and the group IV in the 4th and ensuing periods, more specifically Be, Mg, Ca, Sr, Ba, Zn, Cd, Hg, Al, Ga, In, Tl, Ge, Sn, Pb, As, Sb, Bi, S, Se, Te, etc.

Also examples of the compound (A-2), represented by the general formula (A-2) $R_nM^2_m$, that be effectively employed in the present invention are those compounds which contain, as the component $M^2$, an element selected from the groups III, IV, V and VI of the periodic table in the 3rd and ensuing periods and the groups II, more specifically Be, Mg, Ca, Sr, Ba, Zn, Cd, Hg, Al, Ga, In, Tl, Si, Ge, Sn, Pb, As, Sb, Bi, S, Se, Te, etc.

Among these elements, those of the subgroup (b) in each group are preferred.

Examples of the radical R are mono-, di-, and tri-valent radicals derived from linear or branched, saturated or unsaturated hydrocarbons, and mono-, di- and tri-valent radicals derived from mono- or poly-cyclic saturated or unsaturated hydrocarbons.

As to unsaturated hydrocarbon radicals, there may be employed, in the present invention, not only those containing only one kind of carbon-carbon bond but also those containing at least two of single, double and triple bonds, as long as they meet the purpose of the present invention.

In case of an unsaturated hydrocarbon radical having plural double bonds, such double bonds may be mutually integrated or not.

Preferred examples of the acyclic hydrocarbon radical are alkyl, alkenyl, alkynyl, alkylidene, alkenylidene, alkynylidene, alkylidine, alkenylidine, alkynylidine groups, etc., and the number of carbon atoms in such radical is preferably in the range from 1 to 10, more preferably from 1 to 7, and most preferably from 1 to 5.

In the present invention, R, $M^1$ and $M^2$ are suitably selected in combination within the above-explained ranges of R, $M^1$ and $M^2$, in such a manner that the compound A-1 or A-2 effectively employable under present invention is gaseous in the normal conditions or is easily gasifiable under the conditions of use.

Examples of the compound A-1 effectively employable in the present invention are $BeMe_2$, $MgMe_2$, $Al_2Me_6$, $GaMe_3$, $InMe_3$, $TlMe_3$, $GeMe_4$, $SnMe_4$, $PbMe_4$, $Me_3P$, $Me_3As$, $Me_3Sb$, $Me_3Bi$, $Me_2S$, $Me_2Se$, $Me_2Te$, $BeEt_2$, $MgEt_2$, $Al_2Et_6$, $GaEt_3$, $InEt_3$, $TlEt_3$, $GeEt_4$, $SnEt_4$, $PbEt_4$, $Et_3P$, $Et_3As$, $Et_3Sb$, $Et_3Bi$, $Et_2S$, $Et_2Se$, $Et_2Te$ etc. wherein Me indicates a methyl radical and Et indicates an ethyl radical.

Also examples of the compound A-2 effectively employable in the present invention are $BeMe_2$, $MgMe_2$, $Al_2Me_6$, $GaMe_3$, $InMe_3$, $TlMe_3$, $SiMe_4$, $GeMe_4$, $SnMe_4$, $PbMe_4$, $Me_3P$, $Me_3As$, $Me_3Sb$, $Me_3Bi$, $Me_2S$, $Me_2Se$, $Me_2Te$, $BeEt_2$, $MgEt_2$, $Al_2Et_6$, $GaEt_3$, $InEt_3$, $TlEt_3$, $GeEt_4$, $SnEt_4$, $PbEt_4$, $Et_3P$, $Et_3As$, $Et_3Sb$, $Et_3Bi$, $Et_2S$, $Et_2Se$, $Et_2Te$ etc. wherein Me indicates a methyl radical and Et indicates an ethyl radical.

The life of the active species to be employed in the present invention should be shorter in consideration of the reactivity with the compound A-1 or A-2, but should be longer in consideration of the ease of handling at film formation or the transportation to the film forming space. Also the life of the active species depends on the pressure in the film forming space.

Consequently there is suitably selected active species having an appropriate life time in relation to other film forming conditions allowing effective preparation of a functional film with desired characteristics, including production efficiency.

The active species to be employed in the present invention should be suitably selected, from those having an appropriate life time determined as explained above, in consideration of the chemical affinity with the compound A-1 or A-2, and said life is preferably at least equal to $1 \times 10^{-4}$ sec. in the range of conditions of the present invention, more preferably at least equal to $1 \times 10^{-3}$ sec. and most preferably at least equal to $1 \times 10^{-2}$ sec.

The active species employed in the present invention is to at least function as a so-called initiator in case a chain reaction with the compound A-1 or A-2 takes place, so that the amount of such active species to be introduced into the film forming space may be limited to such an amount capable of efficiently inducing such chain reaction.

The active species employed in the present invention are introduced into the film forming space (A) during the preparation of a deposited film therein, and cause chemical interaction with the compound A-1 or A-2, containing a principal component of the deposited film to be formed, and/or excited species of said compound A-1 or A-2. Thus a deposited film of a desired functional property can be easily formed on a desired substrate.

The present invention can provide a stable CVD process by permitting close control of the temperature of the atmosphere in the film forming space (A) and the temperature of the desired substrate according to the requirements.

The process of the present invention is different from the conventional CVD method firstly in the use of active species prepared in advance in an activation space (C) different from the film forming space (A). This fact not only enables a drastic increase in the deposition speed in comparison with the conventional CVD process but also allows the use of a lower temperature for the substrate at the time of film formation, thus one allowing to produce a deposited film of stable quality and well-controlled characteristics in an industrial scale and at a low cost.

In the present invention, the active species may be prepared in the activation space (C) not only by activation with an energy such as discharge, light and/or heat etc., but also by contact with or with addition of a catalyst.

In case the compound A-1 is employed in the present invention, the material for generating the active species in the activation space (C) is preferably a gaseous or easily gasifiable substance that can generate hydrogen radicals, and specific examples of such substance include $H_2$, $D_2$, HD and rare gases such as He or Ar.

In case the compound A-2 is employed in the present invention, the material for generating the active species in the activation space (C) is preferably a gaseous or easily gasifiable substance that can generate halogen radicals, and specific examples of such substance include halogen gases such as $F_2$, $Cl_2$, $Br_2$ and $I_2$, interhalogen compounds such as BrF, ClF, $ClF_3$, $ClF_5$, $BrF_5$, $BrF_3$, $IF_7$, $IF_5$, ICl and IBr, and rare gases such as He and Ar.

The active species are generated by applying an activation energy, such as electrical discharge, light, heat etc. to the above-mentioned substance in the activation space (C), and the resulting active species are introduced into the film forming space (A). The active species should preferably have a life at least equal to $1 \times 10^{-4}$ sec., and such life time improves the deposition efficiency and deposition speed, and increases the efficiency of chemical reaction with the compound introduced into the film forming space (A).

The activation energy for activating said substance in the activation space (C) includes (a) thermal energy such as heating with a resistor or with infrared light, (b) light energy such as the light from a laser, a mercury lamp or a halogen lamp, and (c) electric energy of a microwave, a high frequency, a low frequency or a direct current. Such various activation energies can be applied singly or in combination to the substance for generating the active species, in the activation space (C). The compound A-1 or A-2 and the active species to be introduced into the film forming space (A) may be respectively selected, among those listed above, in such a manner that they induce a chemical reaction through mutual collisions at a molecular level to form a functional film on a desired substrate. However, in case the compound A-1 or A-2 or the active species lack enough chemical reactivity, or in order to achieve efficiently film formation on the substrate through a more effective chemical reaction, there may also be applied, in the film forming space (A), a reaction stimulating energy acting on the compound A-1 or A-2, and/or on the active species. The reaction stimulating energy may be, for example, the activation energy employed in the aforementioned activation space (C). Otherwise, an excitation energy may be given to the compound A-1 or A-2, prior to the introduction thereof into the film forming space (A), or in another activation space (B) in order to bring said compound to the aforementioned excited state.

In the present invention, the ratio of amounts of the compound A-1 or A-2 introduced into the film forming space (A) and of the active species introduced from the activation space (C) is suitably determined according to the film forming conditions the, nature of compound A-1 or A-2 and the active species and desired characteristics of the functional film. The aforesaid ratio is preferably in the range from 1000:1 to 1:10 as measured by flow rate, and more preferably from 500:1 to 1:5.

In case the actives species do not cause a chain reaction with the compound A-1 or A-2, said ratio of amounts is preferably selected within a range from 10:1 to 1:10, more preferably from 4:1 to 2:3. The pressure in the film forming space (A) at film formation is suitably determined according to the nature of the compound A-1 or A-2 and of the active species and the film forming conditions, but is preferably selected within a range from $1 \times 10^{-2}$ to $5 \times 10^3$ Pa, more preferably from $5 \times 10^{-2}$ to $1 \times 10^3$ Pa, and most preferably from $1 \times 10^{-1}$ to $5 \times 10^2$ Pa In case the substrate has to be heated during film formation, the temperature thereof is preferably selected within a range from 30° to 450° C., more preferably from 50° to 300° C., and most preferably from 50° to 250° C.

The substrate to be employed for film formation in the present invention may be electroconductive or insulating. The conductive substrate can be composed for example of a metal such as NiCr, stainless steel, Al, Cr, Mo, Au, Ir, Nb, Ta, V, Ti, Pt or Pd, or an alloy thereof.

The insulating substrate can be composed for example of a synthetic resin sheet or film such as polyester, polyethylene, polycarbonate, cellulose acetate, polypropylene, polyvinyl chloride, polyvinylidene chloride, polystyrene or polyamide, or glass, ceramic or paper. Such insulating substrate is preferably subjected to an electroconductive treatment at least on a surface thereof, and other films are formed the thus-treated surface.

For example, in case of a glass substrate, the surface thereof is rendered conductive by the formation of a thin film of NiCr, Al, Cr, Mo, Au, Ir, Nb, Ta, V, Ti, Pt, Pd, $In_2O_3$, $SnO_2$ or ITO ($In_2O_3 + SnO_2$). In case of a synthetic resin film such as a polyester film, the surface thereof is rendered conductive by vacuum deposition, electron beam deposition, sputtering or lamination with a metal such as NiCr, Al, Ag, Pd, Zn, Ni, Au, Cr, Mo, Ir, Nb, Ta, V, Ti or Pt. The substrate can be of an arbitrary shape, to be determined according to the requirement, such as cylinder, belt or plate.

There may also be employed a semiconductor substrate such as Si, Ge, GaAs or SOS, or an aforementioned substrate on which another functional film is already formed.

The compound A-1 or A-2 and the active species can be introduced into the film forming space (A) through transport pipes connected thereto, or through such transport pipes which are connected with the film forming space (A) and extended to the vicinity of the film forming surface of the substrate placed in the film forming space (A) and have nozzle-shaped ends, or through double pipes, of which the inner pipe is used for either, for example the active species and the outer pipe is used for the other, for example the compound (A).

It is also possible to employ two nozzles connected to said transport pipes and positioned close to the surface of a substrate already placed in the film forming space (A) to mix the compound A-1 or A-2 and the active species in the vicinity of said surface, at the introduction. Such method is suitable for a pattern formation simultaneous with film forming, since the functional film can be selectively formed on the substrate in this case.

The film forming process of the present invention permits improvements in the electrical, optical, photo-conductive and mechanical properties of the deposited film, improves the reproducibility of film formation, achieves enhanced film quality and uniformity thereof, produces the film in a large area, improves the productivity and achieves easy mass production.

Also said process permits film formation on a substrate low in thermal resistance, since film formation at a lower temperature is now made possible. Also the use of a lower temperature allows the process to be carried out at a faster rate.

The present invention will be further clarified by the following examples.

EXAMPLE 1

200 sccm of $H_2$ gas was introduced, from a gas introduction pipe 102 shown in FIG. 1, into an activation chamber 103 composed of a quartz glass tube, and a microwave of 300W was applied thereto through a wave guide provided thereon as an activation source 105 to generate hydrogen radicals in said activation chamber 103. The hydrogen radicals thus generated were introduced, through a transport pipe 102-2, composed of a quartz glass pipe, into a film forming chamber 104 which was maintained at 8 Pa through a valve 110 by by an evacuation device 111.

Simultaneously $(CH_3)_2Zn$, bubbled with He gas, was introduced into the film forming chamber 104 at a rate of 10 mmol/min through a gas introduction pipe 101, $(CH_3)_2Zn$ was activated by the hydrogen radicals to liberate Zn, thus forming a Zn film of a thickness of about 1 $\mu$m in one hour, over an area of 30×30 cm, on a glass substrate 108, placed on a substrate setting means 107 and heated to about 150° C. by a substrate heater 109.

The Zn film thus formed proved to show no fluctuation in thickness and almost no locality in electric resistance.

EXAMPLE 2

Compounds shown in Tab. 1-A were employed with a flow rate of 1 mmol/min as the compound A-1 in place of $(CH_3)2Zn$, and the process of the Example 1 was repeated except as noted in Tab. 1-A to obtain the films shown therein.

These films were evaluated to have uniform thicknesses and uniform and satisfactory quality.

TABLE 1-A

| Sample | Compound A-1 | Deposited film | Thickness ($\mu$m) | Substrate temp (°C.) | Film quality |
|---|---|---|---|---|---|
| 1 | $(CH_3)_3Ga$ | Ga | 1.1 | 300 | Good |
| 2 | $(CH_3)_3Al$ | Al | 3.0 | 150 | Good |
| 3 | $(C_2H_5)_3In$ | In | 2.0 | 200 | Good |
| 4 | $(CH_3)_4Ge$ | Ge | 1.0 | 250 | Good |
| 5 | $(CH_3)_2Se$ | Se | 5.0 | 30 | Good |
| 6 | $(C_2H_5)_2Te$ | Te | 4.0 | 30 | Good |
| 7 | $(CH_3)_3Sb$ | Sb | 1.5 | 200 | Good |

EXAMPLE 3

In the process of the Example 1, an RF electric power of 3 W (13.56 MHz) was injected by an RF discharge device placed around the film forming chamber 104 to generate a plasma atmosphere therein. The substrate 108 was placed about 1 cm downstream of said plasma atmosphere in order to avoid direct contact therewith. A Zn film of about 3 $\mu$m in thickness was obtained after about 1 hour from the start of the film formation. The substrate was maintained at 100° C. Other parameters were same as those in the Example 1.

Said Zn film was evaluated in the same manner as in the Example 1 and proved to be of satisfactory quality.

The film also proved to be mechanically strong, without peeling from the substrate.

EXAMPLE 4

200 sccm of $F_2$ gas was introduced, from a gas introduction pipe 102-1 shown in FIG. 1, into an activation chamber 103 composed of a quartz glass tube, and a microwave of 300 W was applied thereto through a wave guide provided thereon as an activation source 105 to generate F radicals. The F radicals thus generated were introduced, through a transport pipe 102-2, composed of a quartz glass pipe, into a film forming chamber 104 which was maintained at 8 Pa through a valve 110 by an evacuation device 111.

Simultaneously $(CH_3)_2Zn$, bubbled with He gas, was introduced into the film forming chamber 104 at a rate of 10 mmol/min through a gas introduction pipe 101. $(CH_3)_2Zn$ was activated by the F radicals to liberate Zn, thus forming a Zn film of a thickness of about 1 $\mu$m in one hour, over area of 30×30 cm, on a glass substrate 108, placed on a substrate setting means 107 and heated to about 150° C. by a substrate heater 109.

The Zn film thus formed proved, in an evaluation of the film quality, to show no fluctuation in thickness and almost no locality in electric resistance.

EXAMPLE 5

Compounds shown in Tab. 1-B were employed with a flow rate of 1 mmol/min as the compound A-2 in place of $(CH_3)_2Zn$, and the process of the Example 4 was repeated except as noted in Tab. 1-B to obtain the films shown therein.

These films were evaluated and proved to have uniform thickness and uniform and satisfactory quality.

TABLE 1-B

| Sample | Compound A-2 | Deposited film | Thickness ($\mu$m) | Substrate temp. (°C.) | Film quality |
|---|---|---|---|---|---|
| 1 | $(CH_3)_3Ga$ | Ga | 0.8 | 280 | Good |
| 2 | $(CH_3)_3Al$ | Al | 2.5 | 180 | Good |
| 3 | $(C_2H_5)_3In$ | In | 1.8 | 200 | Good |
| 4 | $(CH_3)_4Ge$ | Ge | 1.0 | 250 | Good |
| 5 | $(CH_3)_2Se$ | Se | 4.0 | 80 | Good |
| 6 | $(C_2H_5)_2Te$ | Te | 4.0 | 100 | Good |
| 7 | $(CH_3)_3Sb$ | Sb | 1.5 | 200 | Good |

EXAMPLE 6

In the process of the Example 4, an RF electric power of 3 W (13.56 MHz) was injected by an RF discharge device placed around the film forming chamber 104 to generate a plasma atmosphere therein. The substrate 108 was placed about 1 cm downstream of said plasma atmosphere in order to avoid direct contact therewith. A Zn film of about 3 $\mu$m in thickness was obtained after about 1 hour from the start of the film formation. The substrate was maintained at 100° C. Other parameters were same as those in the Example 4.

Said Zn film was evaluated in the same manner as in the Example 4 and proved to be of satisfactory quality.

The film also proved to be mechanically strong, without peeling from the substrate.

EXAMPLE 7

A Zn film was prepared by repeated the process of the Example 4, except that $F_2$ gas was replaced by $Cl_2$ gas. Also this film proved to have satisfactory quality.

We claim:

1. Process for forming a deposited film on a substrate in the absence of a plasma atmosphere which comprises:
    (a) generating in an activation space an activated species capable of promoting dissociation of a compound for film formation, said activated species being generated from at least one precursor selected from the group consisting of $H_2$, HD, $D_2$, He and Ar; and
    (b) introducing into a film forming space having said substrate, said activated species and said compound for film formation, said compound for film formation represented by the general formula:

$$R_n M^1 m$$

wherein R is a hydrocarbon radical, $M^1$ is an element selected from the group consisting of Be, Mg, Ca, Sr, Ba, Zn, Cd, Hg, Al, Ga, In, Tl, Ge, Sn, Pb, As, Sb, Bi, S, Se, and Te, n is an integer equal to the valence of $M^1$ and m is a positive integer equal to the valence of R; said film forming space being remote from said activation space; said activated species promoting dissociation of said compound for film formation sufficient to generate chemical species of said compound for film formation, said chemical species capable of directly forming said deposited film whereby said deposited film is formed on said substrate.

2. A process according to claim 1, wherein R is a hydrocarbon radical having 1 to 10 carbon atoms.

3. Process for forming a deposited film on a substrate in the absence of a plasma atmosphere which comprises:
    (a) generating in an activation space an activated species capable of chemically reacting with a compound for film formation, said activated species being generated from the group consisting of $F_2$, $Cl_2$, $Br_2$, $I_2$, BrF, ClF, $ClF_3$, $BrF_5$, $BrF_7$, $IF_5$, ICl, and IBr; and
    (b) introducing into a film forming space having said substrate, said activated species and said compound for film formation, said compound for film formation represented by the general formula:

$$R_n M^2 m$$

wherein R is a hydrocarbon radical, $M^2$ is an element selected from, the group consisting of Be, Mg, Ca, Sr, Ba, Zn, Cd, Hg, Al, Ga, In, Tl, Si, Ge, Sn, Pb, As, Sb, Bi, S, Se, and Te, n is a positive integer equal to the valence of $M^2$ and m is a positive integer equal to the valence of R; said film forming space being remote from said activation space; said activated species initiating a chemical reaction with said compound for film formation sufficient to generate chemical species of said compound for film formation, said chemical species capable of directly forming said deposited film whereby said deposited film is formed on said substrate.

4. A process according to claim 3, wherein R is a hydrocarbon radical having 1 to 10 carbon atoms.

* * * * *

UNITED STATES PATENT AND TRADEMARK OFFICE
CERTIFICATE OF CORRECTION

PATENT NO. : 5,178,904
DATED : January 12, 1993
INVENTOR(S) : SHUNICHI ISHIHARA, ET AL.

It is certified that error appears in the above-identified patent and that said Letters Patent is hereby corrected as shown below:

ON THE TITLE PAGE:

IN [57] ABSTRACT

Line 10, "II-IV" should read --II-VI--.

COLUMN 2

Line 14, "further" should read --further,--.
    Line 20, "a" should read --the--.
    Line 37, "a" should read --the--.

COLUMN 3

Line 25, "called" should read --be called the--.
    Line 27, "that effectively" should read --that can be effectively--.
    Line 30, "from-the" should read --from the--.
    Line 36, "be" should read --can be--.
    Line 68, "under" should read --in the--.

COLUMN 4

Line 1, "in the" should read --under--.
    Line 59, "desired" should be deleted.
    Line 60, "requirements" should read --desired requirements--.
    Line 68, "one" should be deleted.

COLUMN 5

Line 1, "allowing" should read --allowing one--
    Line 56, "the activation" should read --the same as the activation--.
    Line 67, "conditions the," should read --conditions, the--

UNITED STATES PATENT AND TRADEMARK OFFICE
CERTIFICATE OF CORRECTION

PATENT NO. : 5,178,904

DATED : January 12, 1993

INVENTOR(S) : SHUNICHI ISHIHARA, ET AL.

It is certified that error appears in the above-identified patent and that said Letters Patent is hereby corrected as shown below:

COLUMN 6

Line 4, "actives" should read --active--.

COLUMN 7

Line 43, "($CH_3$)2Zn," should read --($CH_3$)$_2$Zn,--.

COLUMN 9

Line 1, "repeated" should read --repeating--.

COLUMN 10

Line 11, "$BrF_5$, $BrF_7$," should read --$ClF_5$, $BrF_5$, $BrF_3$, $IF_7$,--.

Signed and Sealed this

Eleventh Day of January, 1994

Attest:

BRUCE LEHMAN

*Attesting Officer*   *Commissioner of Patents and Trademarks*